United States Patent
Shuey et al.

(10) Patent No.: US 9,733,294 B2
(45) Date of Patent: Aug. 15, 2017

(54) ELECTRICITY METER HOT SOCKET DETECTION

(71) Applicant: Elster Solutions, LLC, Raleigh, NC (US)

(72) Inventors: Kenneth C. Shuey, Zebulon, NC (US); Robert T. Mason, Jr., Raleigh, NC (US)

(73) Assignee: Elster Solutions, LLC, Raleigh, NC (US)

( * ) Notice: Subject to any disclaimer, the term of this patent is extended or adjusted under 35 U.S.C. 154(b) by 232 days.

(21) Appl. No.: 14/264,839

(22) Filed: Apr. 29, 2014

(65) Prior Publication Data

US 2014/0327449 A1  Nov. 6, 2014

Related U.S. Application Data

(60) Provisional application No. 61/818,037, filed on May 1, 2013.

(51) Int. Cl.
*G01R 31/04* (2006.01)
*G01R 31/02* (2006.01)
(Continued)

(52) U.S. Cl.
CPC ......... *G01R 31/025* (2013.01); *G01R 22/068* (2013.01); *G01R 22/063* (2013.01); *G01R 31/045* (2013.01); *G01R 31/1227* (2013.01)

(58) Field of Classification Search
CPC .... G01R 31/04; G01R 31/025; G01R 31/026; H01L 23/481
(Continued)

(56) References Cited

U.S. PATENT DOCUMENTS

| 4,446,426 A | 5/1984 | Emery et al. |
| 5,087,909 A | 2/1992 | Twerdochlib |

(Continued)

FOREIGN PATENT DOCUMENTS

| WO | WO 2007/130185 A1 | 11/2007 |
| WO | WO 2010/129829 A1 | 11/2010 |

OTHER PUBLICATIONS

ELSTER Electricity, LLC (REX Meter, Technology to Empower Utilities), pp. 1-2, Aug. 2005, http://www.wysemeter.com/images/content/2._single_meter.pdf.*

(Continued)

*Primary Examiner* — Giovanni Astacio-Oquendo
(74) *Attorney, Agent, or Firm* — Baker & Hostetler LLP

(57) ABSTRACT

When a poor meter to socket connection occurs, there is the potential for arcing to develop which can result in a hot socket and a fire. Disclosed herein are methods for a meter to detect the occurrence of an arc condition in the socket by analyzing the RF noise on the channels of the communication spectrum used by the meter to communicate within its metering system. For example, by keeping a record of the normal background noise and looking for a broadband increase in the noise on all channels, arc detection can be achieved. Meter quantities such as temperature, current, voltage, and harmonic content may also be used in a standalone manner or in combination with broadband RF noise to detect an arc condition. A disconnect switch within the meter can be opened to remove the arc fault.

12 Claims, 3 Drawing Sheets

(51) Int. Cl.
*G01R 22/06* (2006.01)
*G01R 31/12* (2006.01)

(58) Field of Classification Search
USPC .......................................... 324/538, 500, 537
See application file for complete search history.

(56) References Cited

U.S. PATENT DOCUMENTS

| | | | |
|---|---|---|---|
| 5,477,150 A | 12/1995 | Ham, Jr. et al. | |
| 6,185,422 B1* | 2/2001 | Mattila | H04W 60/04 |
| | | | 455/434 |
| 6,567,250 B1 | 5/2003 | Haun et al. | |
| 7,059,200 B2* | 6/2006 | Sallee | G01F 3/10 |
| | | | 73/861.88 |
| 7,492,163 B2 | 2/2009 | Restrepo et al. | |
| 7,580,232 B2 | 8/2009 | Caggiano et al. | |
| 8,023,235 B2* | 9/2011 | Bilac | H02H 1/0015 |
| | | | 324/500 |
| 8,054,594 B2 | 11/2011 | Wu et al. | |
| 8,193,929 B1 | 6/2012 | Siu et al. | |
| 8,203,463 B2* | 6/2012 | Bragg | H04W 52/0229 |
| | | | 340/870.02 |
| 8,451,572 B2 | 5/2013 | Schweitzer, III | |
| 2001/0004586 A1* | 6/2001 | Choe | H04B 17/309 |
| | | | 455/226.2 |
| 2002/0128035 A1* | 9/2002 | Jokinen | H04W 36/14 |
| | | | 455/552.1 |
| 2004/0001008 A1* | 1/2004 | Shuey | H04Q 9/00 |
| | | | 340/870.02 |
| 2005/0184882 A1* | 8/2005 | Angelis | H04Q 9/00 |
| | | | 340/870.02 |
| 2005/0286185 A1* | 12/2005 | Henson | H02H 1/0015 |
| | | | 361/42 |
| 2006/0061368 A1* | 3/2006 | Furse | G01R 31/11 |
| | | | 324/519 |
| 2007/0252603 A1* | 11/2007 | Restrepo | H02H 1/0015 |
| | | | 324/536 |
| 2008/0129307 A1* | 6/2008 | Yu | H02H 1/0015 |
| | | | 324/522 |
| 2009/0198459 A1* | 8/2009 | Bilac | H02H 1/0015 |
| | | | 702/58 |
| 2010/0207784 A1* | 8/2010 | Bragg | H04W 52/0229 |
| | | | 340/870.03 |
| 2011/0187206 A1 | 8/2011 | Hart et al. | |
| 2011/0249370 A1 | 10/2011 | Nayak et al. | |
| 2012/0264385 A1* | 10/2012 | Oh | H04H 20/22 |
| | | | 455/160.1 |
| 2012/0280717 A1 | 11/2012 | Fu | |
| 2013/0057408 A1 | 3/2013 | Aiken | |
| 2013/0182753 A1* | 7/2013 | Delforce | H04B 17/0085 |
| | | | 375/228 |
| 2015/0309545 A1* | 10/2015 | Shuey | H02J 4/00 |
| | | | 307/130 |
| 2016/0027516 A1* | 1/2016 | Beroset | G06F 8/665 |
| | | | 711/103 |

OTHER PUBLICATIONS

Harrold et al., "Radio Frequency Diagnostic Monitoring of Electrical Machines", IEEE Electrical Insulation Magazine, Mar. 1986, 2(2), 18-24.

* cited by examiner

ELECTRICITY METER HOT SOCKET DETECTION

CROSS-REFERENCE

This application claims the benefit under 35 U.S.C. §119 (e) of Provisional U.S. Patent Application No. 61/818,037, filed on May 1, 2013, and entitled "ELECTRICITY METER HOT SOCKET DETECTION," the content of which is incorporated by reference herein in its entirety.

FIELD OF THE INVENTION

The present disclosure relates to electricity metering, and more particularly, to systems, methods, and apparatus for detecting hot socket conditions at an electricity meter installation.

BACKGROUND

The Smart Grid concept for upgrading electrical systems has brought with it the change-out of millions of electricity meters. Older electromechanical meters are being exchanged for newer solid state electricity meters with communication capabilities, and the majority of these new meters include a whole-house disconnect switch mechanism. Many of the electricity meters being replaced have been in service at residential locations for years. An electricity meter installation generally does not get serviced or maintained, so some of the older meter sockets in which those meters were installed may have deteriorated over time. Installation of a new electricity meter into a deteriorated meter socket may create a poor electrical connection even though the meter being installed is in good working order.

Typically, a single-phase ANSI meter has four blades that extend out of a thermoplastic base. These blades insert into spring loaded jaws of a meter socket that is typically mounted on the wall of a residence. In some of the older residential locations, the jaws of the meter socket may have lost the contact force to mate solidly with the meter blades. An installer may not recognize that one or more blades are not making as good contact as desired at time of installation.

Poor electrical connection between the meter and socket can create a situation where an arc can develop within the meter-to-socket interface. There have been occasions where house fires have resulted from a sustained arc condition of this meter-socket type.

Attempts have been made to sense "hot socket" conditions by measurement of blade temperature, socket temperature, or meter temperature. Unfortunately, sensing temperature of these elements during an arc event requires that the arc exist for a sufficiently long time to generate intense heating. There is a possibility that by the time the heat is detected, the arc condition may sufficiently degrade the equipment to create a dangerous situation.

There have also been attempts to solve a related problem using AFCI devices for residential applications. These AFCI devices sense voltage and/or current associated with a load and attempt to develop a "signature" that is associated with an arc condition. The characteristics of the arc are typically sensed by looking at different frequencies of noise that can be present in the voltage and current signals on the power line. If an arc is detected, the AFCI device can open the load current and remove the arc condition if it's on the circuit being monitored. Other attempted solutions for arc detection have involved sensing the light generated by an arc.

SUMMARY

This disclosure relates to an electricity meter and method for determining whether an arc condition exists between the meter and a socket. The electricity meter is used for metering electrical energy delivered from a voltage source to an electrical load. The meter is disposed between the voltage source and the electrical load. The meter comprises blades, a radio frequency (RF) transceiver, and a processor. The blades are for connecting the meter to the socket. The RF transceiver is used for meter communications, such as for transmitting collected meter data to a utility head end via a wireless communication network. In that regard, the RF transceiver will both transmit and receive communications on a given frequency. The transceiver may also measure received signal strength on a communication channel or frequency and generate a value indicative of the received signal strength. Such values are commonly referred to as received signal strength indicator (RSSI) value. The transceiver may generate RSSI values in the RF communication spectrum for all communication channels employed by the transceiver for communications. The processor receives the RSSI values generated by the transceiver and determines therefrom whether an arc condition exists between the blades and the socket.

BRIEF DESCRIPTION OF THE DRAWINGS

The foregoing summary, as well as the following detailed description of illustrative embodiments of the present application, will be better understood when read in conjunction with the appended drawings. For the purposes of illustrating the present application, there is shown in the drawings illustrative embodiments of the disclosure. It should be understood, however, that the application is not limited to the precise arrangements and instrumentalities shown. In the drawings.

DETAILED DESCRIPTION

Disclosed herein are methods and systems for detecting the occurrence of an arc condition in an electricity meter/socket installation by examining characteristics of radio frequency (RF) communications conducted by a transceiver of an electricity meter in the industrial, scientific and medical (ISM) communication spectrum. By keeping a record of the normal background noise on the ISM channels employed by the meter and detecting a broadband increase in the noise on all ISM channels, arc detection can be achieved. In one embodiment, a disconnect switch within the meter can be opened to remove the arc fault. In other embodiments, other meter measurements, alone or in combination with RF sensing, may be employed to detect an arc condition, including, for example, current magnitude, voltage magnitude, and/or temperature information.

Figure 1:
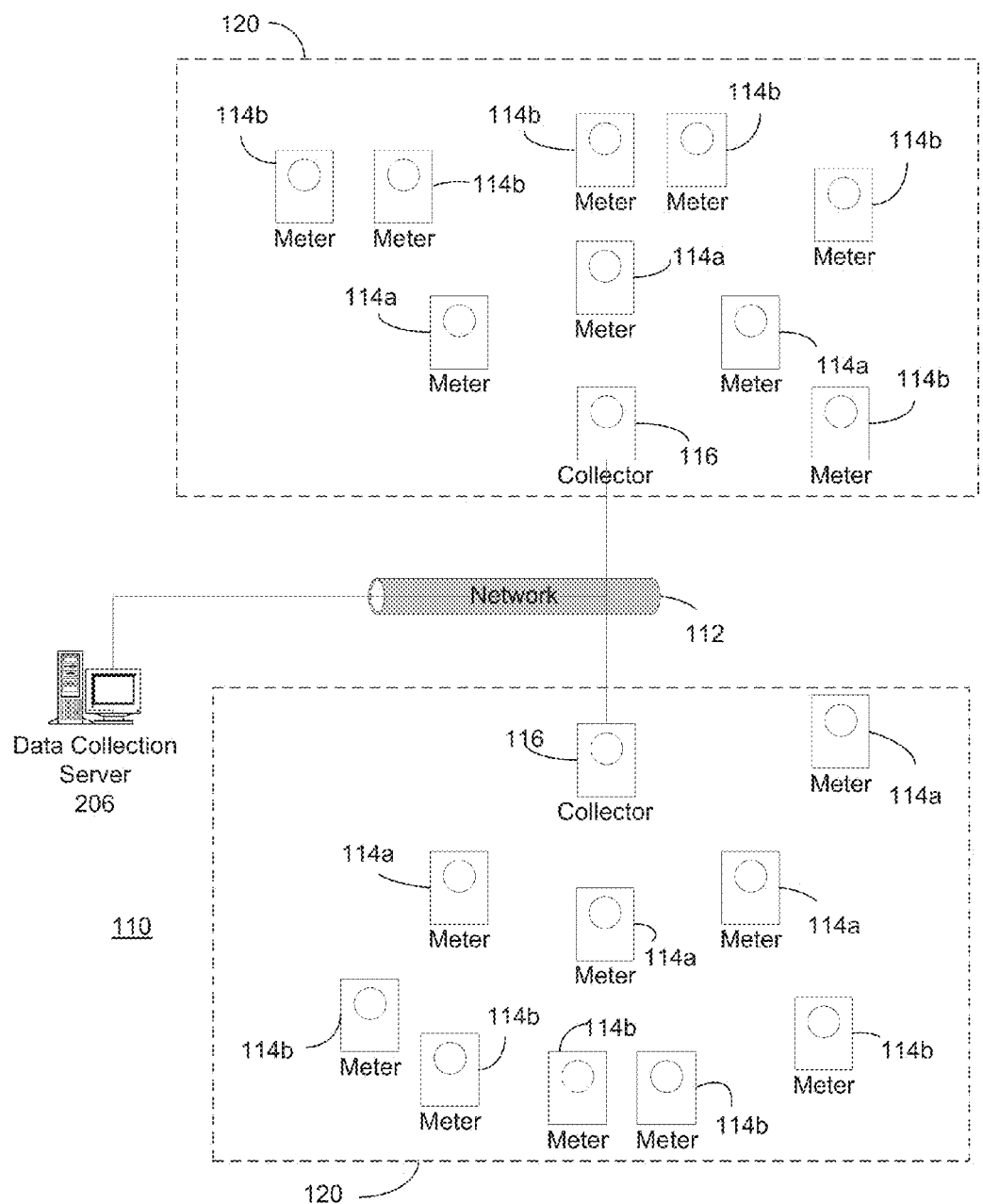
FIG. 1 illustrates an embodiment of an exemplary metering system in which the arc detection methods disclosed herein may be embodied.

FIG. 1 provides a diagram of one exemplary metering system 110 in which the arc detection methods described herein may be employed. System 110 comprises a plurality of meters 114, which are operable to sense and record consumption or usage of a service or commodity such as, for example, electricity, water, or gas. Meters 114 may be located at customer premises such as, for example, a home or place of business. Meters 114 comprise circuitry for measuring the consumption of the service or commodity being consumed at their respective locations and for generating data reflecting the consumption, as well as other data related thereto. Meters 114 may also comprise circuitry for wirelessly transmitting data generated by the meter to a remote location. Meters 114 may further comprise circuitry for receiving data, commands or instructions wirelessly as well. Meters that are operable to both receive and transmit data may be referred to as "bi-directional" or "two-way" meters, while meters that are only capable of transmitting data may be referred to as "transmit-only" or "one-way" meters. In bi-directional meters, the circuitry for transmitting and receiving may comprise a transceiver. In an illustrative embodiment, meters 114 may be, for example, electricity meters manufactured by Elster Solutions, LLC and marketed under the tradename REX. One example of a transceiver that may be employed in such a meter and used in connection with the arc detection method disclose herein is a Silicon Labs SI4461.

System 110 further comprises collectors 116. In one embodiment, collectors 116 are also meters operable to detect and record usage of a service or commodity such as, for example, electricity, water, or gas. In addition, collectors 116 are operable to send data to and receive data from meters 114. Thus, like the meters 114, the collectors 116 may comprise both circuitry for measuring the consumption of a service or commodity and for generating data reflecting the consumption and circuitry for transmitting and receiving data. In one embodiment, collector 116 and meters 114 communicate with and amongst one another using any one of several wireless techniques such as, for example, frequency hopping spread spectrum (FHSS) and direct sequence spread spectrum (DSSS).

A collector 116 and the meters 114 with which it communicates define a subnet/LAN 120 of system 110. As used herein, meters 114 and collectors 116 may be referred to as "nodes" in the subnet 120. In each subnet/LAN 120, each meter transmits data related to consumption of the commodity being metered at the meter's location. The collector 116 receives the data transmitted by each meter 114, effectively "collecting" it, and then periodically transmits the data from all of the meters in the subnet/LAN 120 to a data collection server 206. The data collection server 206 stores the data for analysis and preparation of bills, for example. The data collection server 206 may be a specially programmed general purpose computing system and may communicate with collectors 116 via a network 112. The network 112 may comprise any form of network, including a wireless network or a fixed-wire network, such as a local area network (LAN), a wide area network, the Internet, an intranet, a telephone network, such as the public switched telephone network (PSTN), a Frequency Hopping Spread Spectrum (FHSS) radio network, an ISM mesh network, a Wi-Fi (802.11) network, a Wi-Max (802.16) network, a land line (POTS) network, or any combination of the above.

Figure 2:
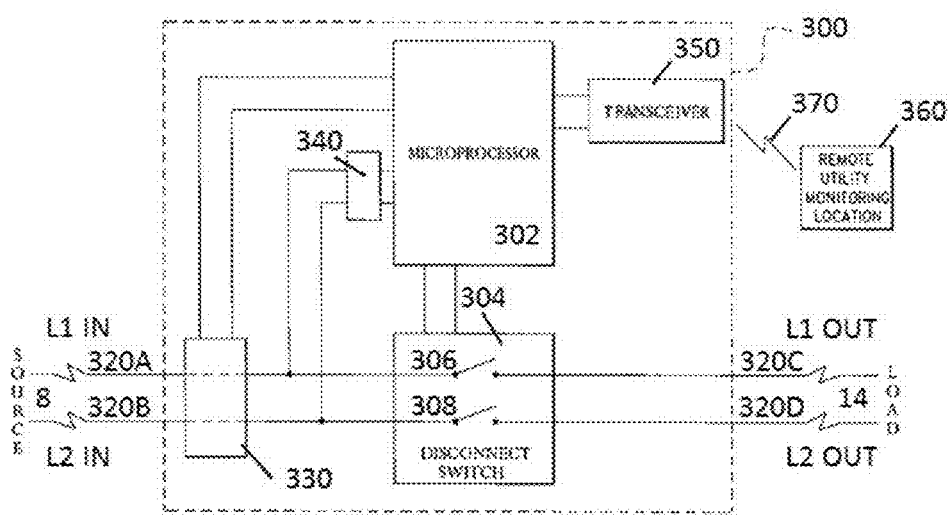
FIG. 2 is a schematic of an electricity meter with a transceiver and a disconnect switch.

FIG. 2 is a schematic diagram of an embodiment of an electricity meter 300, which may be one of the meters 114 or collectors 116 in the system of FIG. 1. As shown, the meter 300 may be disposed between an electrical energy source 8 and an electrical load 14, and it functions to meter electrical energy delivered from source 8 to the load 14 via feeder lines 320 at a subscriber location. A disconnect switch 304 may be interposed into the feeder lines 320, for switching between an open position, in which electrical energy is not supplied to the electrical load 14, and a closed position, in which electrical energy is supplied to the electrical load.

The meter 300 also comprises a processor 302, such as a microprocessor, which executes computer-readable instructions (program code) that may be stored within a memory (not shown) of the meter. These computer-executable instructions, when executed by the processor, cause the processor to perform various functions within the meter, such as determining energy consumption and operating other components with the meter. As further shown, the meter 300 also includes a transceiver 350 which may be used by the processor to transmit and receive information to/from a meter network, such as the meter network illustrated in FIG. 1. In one embodiment, the transceiver may comprise a Silicon Labs SI4461.

The transceiver 350 may be configured to measure received signal strength on an RF communication frequency or channel of a wireless communication network and to generate a receive signal strength indicator (RSSI) value therefrom. RSSI is an indication of the power level being received by the antenna of the transceiver. Typically, the higher the RSSI value, the stronger the signal. RSSI can be used internally in a transceiver to determine when the amount of radio energy in a channel is below a certain threshold at which point the transceiver may be clear to transmit on the channel. Conversely, an RSSI value above a certain threshold may be an indication that another device may be transmitting on the channel, in which case the transceiver may try to lock-on to the signal being transmitted on that channel.

The transceiver 350 may be employed by the processor to communicate with a remote utility monitoring location 360 via a remote connection 370. As further shown, the meter 300 may further comprise a current sensor 330 and a source-side voltage sensor 340 that may provide current and voltage signals to the processor 302 to be used in determining energy consumption.

According to the arc detection methods described herein, meters in a meter communication network that employs ISM mesh communications, such as the meters illustrated in FIG. 1 and FIG. 2, may be configured to detect arc conditions based on an examination of the signal strength present on the frequencies (i.e., channels) employed in the communication system. Metering nodes (e.g., meters 114 and collectors 116) in an ISM mesh network typically scan all frequencies within the ISM communication band to detect a signal to receive. For example, the communication system may employ as many as twenty-five (25) or even fifty (50) discrete frequencies/channels. The transceiver in a meter typically scans each frequency in an attempt to detect a transmission from another node in the network on that frequency. When scanning a given channel, the transceiver will measure the signal strength on that channel and will generate a received signal strength indicator (RSSI) value indicative of the detected RF power on that channel. The transceiver may then compare the RSSI value to a threshold to make a determination as to whether another device is attempting to transmit on that channel. If so, the transceiver may attempt to lock-on to the signal being transmitted on that channel.

Figure 3:
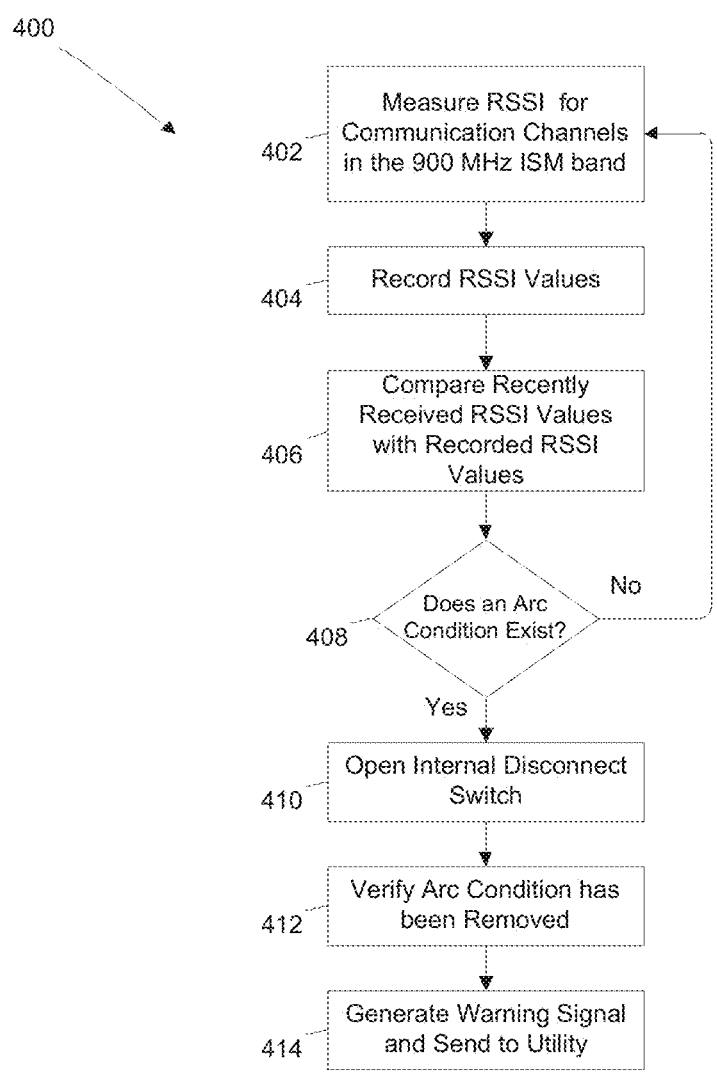
FIG. 3 is a diagram illustrating an embodiment of a method for detecting an arc condition.

FIG. 3 is a flow diagram illustrating a method (400) of detecting arc conditions using detected RF energy, in particular RSSI values, to determine whether an arc condition is present, in accordance with one embodiment. The method (400) may be performed using a meter such as the one illustrated in FIG. 2, however, it should be appreciated that the method (400) disclosed herein may be implemented in any suitable meter configuration that employs an RF transceiver. In this embodiment, it is assumed that the meter transceiver is an ISM mesh radio or other radio device able to detect signals within the ISM communication band. While a non-synchronous ISM system is already scanning at all frequencies within the ISM frequency band, a synchronous system can also be adapted to periodically look at RSSI magnitudes to determine if an arc condition exists. Thus, the methods disclosed herein can be implemented in any wireless networking communication system for wireless meter reading.

In accordance with the present embodiment, as shown in FIG. 3, at step 402, the transceiver (e.g., transceiver 350 of FIG. 2) may measure received signal strength on various frequencies/channels within its frequency spectrum, during normal scanning of those channels in connection with its normal communication functions. At step 404, the processor of the meter may record, or store, the RSSI values measured on those channels, for example, in the internal memory of the meter's processor (e.g., processor 302) or in a memory separate from the processor. At some point thereafter, in step 406, the processor may compare newly received RSSI values from the transceiver 350 with the previously obtained values stored in step 404. Based on this comparison, in step 408, the processor may then determine whether an arc condition exists within or around the meter socket. Several different methods for making this determination based on the RSSI comparison are discussed in more detail below. If an arc condition has been determined to exist, then at step 410, an internal disconnect switch within the meter (e.g., disconnect switch 304) may be operated to the open position, thereby disconnecting the meter from the source and removing the meter load and thereby the arc condition. At step 412, the removal of the arc condition may then be verified and, at step 414, the processor may generate a signal indicating that an arc condition was detected and send that signal to the utility via the meter transceiver. If, on the other hand, no arc condition is detected in step 408, then control may pass back to step 402 where the transceiver continues its normal scanning operations and repeats the process.

An electrical arc condition is characterized by extremely high temperatures (thousands of degrees Kelvin). In experiments associated with this disclosure, it was determined that a welding arc has energy not only at hundreds of kHz and in the light spectrum, but also there is energy within the ISM 900 MHz spectrum. Effectively, the arc energy develops a broadband "signature" RF noise signal across almost all frequencies in the RF spectrum.

In testing for this arc problem, a meter with special firmware was used to evaluate the instantaneous RSSI values for all communication channels in the 900 MHz ISM spectrum. A condition was set up at a residential site where no arc existed and the background noise RSSI values were recorded. Then an arc was generated and with the arc present, the RSSI values were again read for the ISM 900 MHz channels. It was determined from this set of tests that the RSSI values for all the narrowband channels across the ISM spectrum increased 10-15 dB when the arc was present. This type of result at several feet away from the arc means that the meter can use the transceiver or ISM radio—in particular its ability to measure RSSI on the ISM channels—to detect the presence of an arc condition. This is especially true if the arc condition is situated in close proximity to a radio antenna of the transceiver, as it would be for a case where the arc exists at the connection of the meter blades to the meter socket.

Because an arc's energy characteristic can follow an AC voltage and/or current waveform, extinguishing at zero current crossover and reigniting shortly afterwards as the voltage builds up, it is preferable to scan for RSSI values away from the zero crossover of the AC voltage or current. This scan placement or timing within the AC waveform can be incorporated into the "arc scan" method of FIG. 3 along with comparisons between average broadband background noise (RSSI values) and newly measured broadband noise (RSSI values).

Because the transceiver, or meter radio, should be able to scan for an arc condition almost instantaneously (e.g., less than 1 msec), the arc condition may be detected rapidly upon occurrence and an early warning signal may be generated to the utility. As illustrated in step 410 of FIG. 3, the meter may also make a decision to open an internal disconnect switch of the meter to remove the meter loading and thereby eliminate the arc condition. An arc condition requires a finite level of current to exist (typically a minimum of at least 0.5-1 Amp for most metals), so by opening the disconnect switch all loads at the subscriber location will be removed and the arc condition will be extinguished. This is particularly important since even a moderately high current arc condition can be extremely destructive in a short amount of time. After the disconnect switch is operated to the open position, the removal of the arc condition may be verified.

Determining whether an arc condition exists in step 408 of FIG. 3 may incorporate a variety of information and techniques. In one embodiment, the determination is made as described in connection with FIG. 3 by simply monitoring ongoing RF noise levels (RSSI values) for all channels in the ISM spectrum and then comparisons the new readings to the previously stored readings (e.g., stored within the internal memory of the meter processor). If the comparisons result in immediate broadband increases in noise (e.g., a threshold increase of 10-15 dB or more) covering most, if not all ISM channels, this may be determined to be an arc condition. As mentioned earlier, arc noise can follow the AC current waveform so an increase in RF broadband noise at the peak of the current waveform coupled with a significant reduction of RF broadband noise at or near zero voltage/current crossover may also be determined to be an indication of an arc.

In other embodiments, the method for determining whether an arc condition exists may directly compare the per-channel RF noise (RSSI value) at the peak of the current waveform as compared to the noise (RSSI value) on the same channel at or near the zero crossing of the current waveform. Alternatively, an arc condition may be indicated when the number of channels on which the RSSI is greater than the previous RSSI readings for the same channels by more than, for example 15 db, is greater than, for example 80% of the total number of channels scanned. In various embodiments, the threshold db value (e.g., 15 db) and threshold number of channels (e.g, 80%) may be configurable and/or may initially be set to default values. Preferable, the change in db value is in the range of 10 db to 20 db. Preferably the threshold number of channels is in the range of 70% to 80%.

In other embodiments, other meter measurements, such as current magnitude, voltage magnitude and/or meter temperature, may be coupled with the RF arc sensing method disclosed above to enable improved prediction of arc conditions, or those other measurements may be used in a standalone manner. For example, a sudden 10% reduction in current magnitude coupled with increased RF broadband noise or increased harmonic noise could be predictive of an arc condition (arc voltage would decrease normal current). Similarly, a sudden 10% reduction in input voltage coupled with increased RF broadband noise or increased harmonic noise could be predictive of an arc condition (arc voltage at the input blades would decrease sensed input voltage). Also, a continually increasing meter temperature coupled with increased RF broadband noise and/or increased harmonic noise could be predictive of an arc condition. In yet another embodiment, an increase in harmonic content of the input AC voltage and/or current waveforms alone or coupled with an increase in broadband RF noise could be used to trigger an arc condition alert. Any, or all of these conditions, in any possible combination, could be included as part of the arc detection methods disclosed herein. And any or all of these conditions and/or measurements may be utilized in a stand-alone detection system that relies on broadband RF noise levels and/or harmonic noise as a part of the arc detection system.

In an alternate embodiment, an unsafe condition may be detected by computing a relative meter temperature using the measured internal meter temperature and several other channels of data that may be measured by the meter or downloaded to the meter. For example, the following channels may be used: (i) internal meter temperature as measured by the meter electronic assembly; (ii) per phase current, i.e. rms amps, as measured by the meter; and/or (iii) temperature profile, where a temperature profile may be downloaded on a periodic basis, e.g. daily, and provide the approximate ambient air temperature for each time period of the day.

In one embodiment, for an averaging window, e.g. 5 minutes, the meter records the above quantities (e.g., in an internal memory of the meter processor) and these channels of interval data may be read from the meter. In addition, the meter may compute a relative temperature, by first subtracting a temperature offset from the internal meter temperature, where the temperature offset is computed based on the average per phase current measured by the meter. The per phase current temperature offset may be computed or provided as an input, where typically the temperature offset is zero degrees at zero current to a maximum temperature offset, e.g. 15 degrees C., at the meter maximum rated current, e.g. 200 A. The computed relative temperature may then be compared to the downloaded temperature for the corresponding time period of the day, and if the difference between the relative temperature and the temperature profile value is greater than a configurable threshold, the meter flags an "over temperature" warning and can optionally open the service disconnect switch.

In other embodiments, additional inputs may be used to further define the relative temperature computation and could be based on: (i) different ambient temperature profiles based on meter direction and estimated sun loading; and/or (ii) a parameter based on the measured power supply load. Optionally, the power supply load can be estimated based on the known duty cycle of key loads, e.g. radio transmit duty cycle.

The above temperature-based alerting mechanism improves on simple temperature-based methods that do not account for differences in ambient temperature or other loads that affect the internal meter air temperature.

It is understood that any or all of the arc detection methods, processes, and systems described herein, such as, for example, the steps illustrated in FIG. 3, may be embodied in the form of computer executable instructions (i.e., program code) stored on a computer-readable storage medium which instructions, when executed by a processor (e.g., processor 302 of FIG. 2), perform and/or implement the methods, processes, and systems described herein. Computer readable storage media include both volatile and nonvolatile, removable and non-removable media implemented in any method or technology for storage of information. Computer readable storage media include, but are not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other medium which can be used to store the desired information and which can be accessed by a computer. These storage media may be integrated into processor 302 of FIG. 3 or may be separate components within the meter 300, for example. As used herein, the term "computer readable storage media" does not include signals.

While the disclosure is described herein using a limited number of embodiments, these specific embodiments are for illustrative purposes and are not intended to limit the scope of the disclosure as otherwise described and claimed herein. Modification and variations from the described embodiments exist. The scope of the invention is defined by the appended claims.

What is claimed is:

1. An electricity meter for metering electrical energy delivered from a voltage source to an electrical load, said electricity meter disposed between said voltage source and said electrical load, the electricity meter comprising:
   blades for connecting the electricity meter to a socket;
   a transceiver that communicates wirelessly on a plurality of channels of a radio frequency (RF) communication system, the transceiver measuring received signal strength on each of the plurality of channels and generating a received signal strength indicator (RSSI) value indicative of the received signal strength on each of the plurality of channels, the transceiver using the RSSI value for each of the plurality of channels to determine whether another device is attempting to transmit on at least one of the plurality of channels; and
   a processor that receives the RSSI value for each of the plurality of channels from the transceiver and determines therefrom whether an arc condition exists between the blades and the socket.

2. The electricity meter of claim 1, wherein the RF communication system comprises an industrial, scientific, and medical (ISM) mesh networking system.

3. The electricity meter of claim 2, wherein the ISM mesh networking system comprises a utility, wherein the utility is signaled when the processor determines that an arc condition exists.

4. The electricity meter of claim 1, wherein the processor generates a warning signal when an arc condition is determined to exist.

5. The electricity meter of claim 1, further comprising an internal disconnect switch, wherein when the arc condition is determined to exist, the processor operates the internal disconnect switch to an open position to remove a meter load and thereby eliminate the arc condition.

6. The electricity meter of claim 5, wherein the meter is configured to verify that the arc condition has been removed.

7. The electricity meter of claim 1, wherein the transceiver is in close proximity to the blades.

8. The electricity meter of claim 1, wherein the processor determines whether the arc condition exists within 1 millisecond.

9. The electricity meter of claim 1, wherein the transceiver detects RSSI values in an industrial, scientific, and medical (ISM) 900 MHz band.

10. The electricity meter of claim 1, wherein the metering processor is configured to determine that the arc condition exists when at least 70% of the RSSI values measured by the transceiver on each of the plurality of channels of the RF communication system are determined to have increased by at least 10 db.

11. The electricity meter of claim 1, wherein the electricity meter is configured to store a record of each RSSI value for each of the plurality of channels, and the processor is configured to determine whether the arc condition exists by comparing the stored RSSI value for at least one of the plurality of channels with a more recently measured RSSI value for the at least one of the plurality of channels at the peak and at or near the zero crossing of a current or voltage waveform.

12. The electricity meter of claim 1, wherein the processor is configured to receive temperature, current, voltage, and harmonic content and determine therefrom, in combination with the RSSI value for each of the plurality of channels, whether the arc condition exists.

* * * * *